United States Patent [19]

Bumble et al.

[11] Patent Number: 4,637,853

[45] Date of Patent: Jan. 20, 1987

[54] HOLLOW CATHODE ENHANCED PLASMA FOR HIGH RATE REACTIVE ION ETCHING AND DEPOSITION

[75] Inventors: Bruce Bumble, Croton-on-Hudson; Jerome J. Cuomo, Lake Lincolndale; Joseph S. Logan, Poughkeepsie; Steven M. Rossnagel, White Plains, all of N.Y.

[73] Assignee: International Business Machines Corporation, Armonk, N.Y.

[21] Appl. No.: 759,762

[22] Filed: Jul. 29, 1985

[51] Int. Cl.$^4$ .................. B44C 1/22; C03C 15/00; C03C 25/06; C23F 1/02

[52] U.S. Cl. ..................... 156/345; 118/50.1; 118/620; 118/728; 156/643; 156/646; 204/298; 204/192.32

[58] Field of Search ............... 118/728, 50.1, 620; 427/38, 39; 204/164, 192 EC, 192 E, 298; 156/345, 643, 646, 657, 662, 663

[56] References Cited

U.S. PATENT DOCUMENTS 4,209,357  6/1980  Gorin et al. ............ 156/345 X
4,521,286  6/1985  Horwitz ............... 156/646 X

FOREIGN PATENT DOCUMENTS 0034706  9/1981  European Pat. Off. ......... 156/345

Primary Examiner—William A. Powell
Attorney, Agent, or Firm—Roy R. Schlemmer

[57] ABSTRACT

A metallic hollow cathode electrode structure for use in a RF-RIE sputter/etch system. The electrode defines a critical aspect ratio hollow cathode volume. In accordance with one embodiment of the invention, the electrode structure may consist of two closely spaced metal elements separated by a distance of a few centimeters. The elements are electrically and structurally connected by supports around their outer rim. An RF voltage is applied between the improved hollow cathode electrode structure and an evacuated chamber containing same through a suitable matching network. A plasma gas is supplied to the system from a point outside the electrodes and a suitable pumping system is used to maintain operating pressures in the 0.1 to 400 millitorr range. Samples to be sputtered are then placed on either of the inside electrode surfaces for sputter/etching. The aspect ratio (longest dimension of one of the elements/spacing between the elements) should be at least 4.

According to a further embodiment, the hollow cathode electrode structure is characterized by a single plate having a plurality of cylindrical chambers or holes therein, each hole producing a hollow cathode glow when the system is energized. The aspect ratio (largest dimension of the chamber cross-section/depth of the chamber) for this embodiment should be at least 1.5.

4 Claims, 11 Drawing Figures

ETCHING OF POLYIMIDE ON CERAMIC AT ROOM TEMPERATURE 10% $CF_4$ IN OXYGEN

ETCHING OF POLYIMIDE AS A FUNCTION OF PRESSURE

FIG. 3

ETCHING RATES OF POLYIMIDE IN RF HOLLOW CATHODE MODE POLYIMIDE IS ON CERAMIC ROOM TEMPERATURE

ETCHING OF POLYIMIDE BY RF HOLLOW ELECTRODES

COMPARISON OF BUCKET HOLLOW CATHODE ELECTRODES VRS PLANAR ELECTRODES

PRESSURE = 25 MICRONS Ar, Cu ELECTRODES

POSITION FROM CENTER OF ELECTRODE

COPPER DEPOSITION RATE AT 500 WATTS INCIDENT RF POWER

COMPARISON OF BUCKET HOLLOW CATHODE ELECTRODES VRS PLANAR ELECTRODES

COPPER DEPOSITION RATE AT 500 WATTS INCIDENT RF POWER

HOLLOW CATHODE ENHANCED PLASMA FOR HIGH RATE REACTIVE ION ETCHING AND DEPOSITION

BACKGROUND OF THE INVENTION

Radio Frequency (RF) sputtering is a technique which is well known and described well in the literature (B. Chapman, "Glow Discharge Process", J. Wiley and Sons, NY, 1980, p 135-173). It is a type of diode sputtering with a cathode electrode, an effective anode, and a plasma within a vacuum chamber. The electrodes are typically driven at high voltage (1000-1500 volts) and high frequency (13.56 megahertz). The plasma is formed by the high voltage induced breakdown of the gas in the chamber, and typically assumes a plasma potential near ground, which is the potential of the chamber walls. The cathode electrode is bombarded at high energy by ions in the plasma during the "negative" portion of the applied voltage and by electrons during the "positive" part. Thus, no net charge flows through the cathode electrode. The cathode electrode is sputtered by the high energy ion bombardment. This sputtering is used either for erosion of samples on the cathode surface, or net deposition on samples placed on an opposing surface with suitable support.

Reactive Ion Etching is a technique which adds a chemical reaction to this ion bombardment process. Certain gases, such as freon, oxygen, silane, etc., are chemically active with a number of common materials used in device fabrication (silicon, quartz, polyimide, etc.). When used in an RF sputtering system, these reactive gases cause additional etching of the surface (over sputtering alone) by chemically combining with surface atoms and forming a volatile species which leaves the surface and can be pumped away. Typically, the operating pressure and gas flow rate would be higher in a reactive ion etching device as compared to a simple RF device alone, but the underlying operation of the plasma would be similar and dominated by the RF applied voltages.

Recently, a related device has been developed (C. Horwitz, Applied. Physics. Letter, Vol. 43, 1983, p 977), which used a hollow cathode glow to enhance the plasma in the RF plasma. This device was characterized under similar operating conditions to a regular RF device, and produced higher etch rates. The herein disclosed invention, although similar in structure, constitutes a distinct improvement over the Horwitz device and has a number of operating advantages, which will be described later.

DESCRIPTION OF PRIOR ART

U.S. Pat. No. 4,431,473 describes a magnetron-based reactive etching device with multiple chambers. The patent system differs from the present invention in a number of significant ways. The present invention is not a magnetron, and has no magnetic fields associated with its operation.

U.S. Pat. No. 4,431,473 is a magnetron device, and will not function without a magnetic field. The present invention utilizes an electrostatic confinement technique known as a hollow cathode, in which the sheaths present with a plasma are used to better confine the plasma leading to higher plasma density. U.S. Pat. No. 4,431,473 does not use this hollow cathode-based effect, and simply has separate chambers for such things as the magnet assembly, the gas inlet, etc.

An article entitled "Variable Angle Dry Etching with a Hollow Cathode", by C. M. Horwitz, Applied Physics Letters, Vol. 44, (June 1984) describes forming a hollow cathode within two spaced electrodes, as is done in the present invention. However, a different type of plasma is formed. It is not characterized by the low voltages found in the present invention. The low voltage operation is the key to high rate operation in the reactive ion etching mode. An additional difference is in the area of DC bias voltage, which is a measure of both the applied RF potential and the electrode areas and plasma density. In the present device, the DC potentials are very low, to the point of approaching zero. This leads to slightly higher plasma potentials than a conventional plasma, but is indicative of a strongly enhanced plasma in the electrode area. Horwitz' work is not characterized by these low voltages, and thus the level of the enhancement in that case is significantly lower.

To summarize, Horwitz does bring up the topic of hollow cathode effects in RF devices, but the demonstration of the effect is feeble. The effect is well demonstrated and characterized in the present invention and the level of operation significantly exceeds that of Horwitz.

In another article by C. M. Horwitz entitled "Hollow Cathode Reactive Sputter Etching—A New High Rate Process", Applied Physics Letters, Vol. 43 (Nov. 1983), p 977, he describes a hollow cathode system developed primarily for use in sputtering (or sputter etching) and not particularly for reactive ion etching. The significant differences between this Horwitz system and that of the present invention is as follows:

The present invention operates at 40% or lower voltage than the conventional RF system. Horwitz' device operates at 100% (his FIG. 2). The lower voltage means more ion flux (effective current) thus, leading to significantly higher rates at the same power.

The present invention is operational and demonstrated to sizes greater than 600 cm in diameter with only a 2 cm spacing. Horwitz used only a small 5 cm system with complicated geometrical trapping by floating electrodes. This indicates the lack of a true hollow cathode glow.

The present invention also demonstrates the practicability of making 2, 3 or as many hollow cathode glows as desired. This has a number of extremely practical industrial applications.

The present invention also evaluates the effect of the hollow cathode surface area to spacing ratio. By control of this ratio, the plasma potential is controlled, which strongly affects the etching rate.

The present invention is well suited to high rate RIE of polymer films, due to the low voltage (low damage) and control of the plasma potential. This would not be true of Horwitz.

Further, the low voltage operation in the RIE mode results in no contamination of the sample from the electrode material by electrode sputtering. This was not addressed at all in Horwitz and would not be possible as described.

SUMMARY AND OBJECTS

It is a primary object of the present invention to provide a hollow cathode enhanced high rate RF sputtering system capable of low voltage high current density operation.

It is a further object to provide a method of operating such a system in said preferred low voltage high current density mode.

It is another object of the invention to provide such a system adapted to a high production environment having a plurality of low cathode regions within the same structure.

It is yet another object to provide a unique multiple aperture hollow cathode configuration for use in such an RF sputter/etch system for enhancing the hollow cathode effect at the electrode surface to achieve even greater electron density with an attendant increase in etching rate.

Other objects, features, and advantages of the invention will be apparent from the following description of the invention with reference to the included drawings.

The objects of the present invention are accomplished in general by a recognition that establishing a hollow cathode glow in a RF reactive ion etching or sputter deposition system and adjusting the system parameters to provide low voltage high current density operation which results in a significantly more efficient operation of the overall system. The invention provides greater etch/deposition rates and allows materials to be processed due to the low voltage operation possible which could not be effectively processed otherwise.

The hollow cathode glow may be established between two or more closely spaced plate electrodes or an alternative embodiment in a single plate electrode having a series of holes or apertures in the surface thereof in which a hollow cathode glow region is established. This alternative embodiment has been termed a "bucket hollow cathode".

DESCRIPTION OF EMBODIMENT

Figure 1:
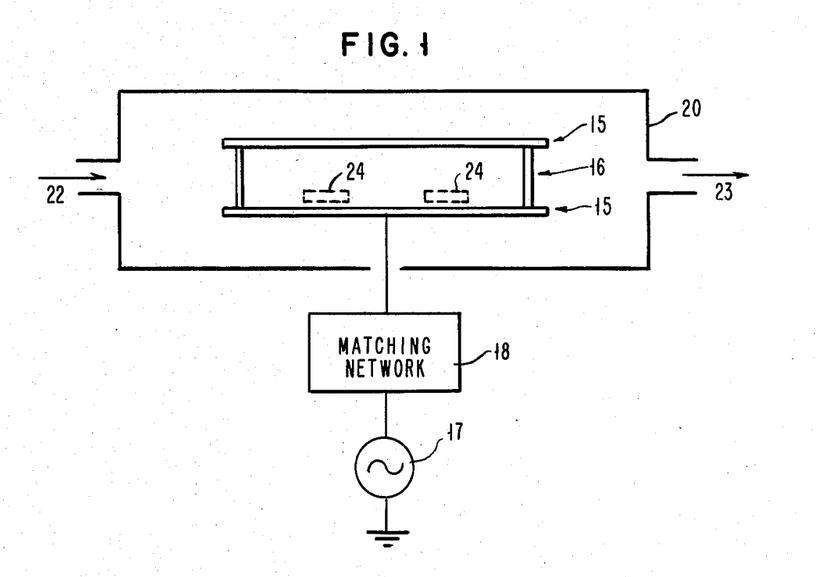
FIG. 1 comprises a cross sectional view of a simplified reactive ion sputter/etching system showing a first embodiment of the hollow cathode structure of the present invention in place within appropriate vacuum chamber.

The most general embodiment of the invention consists of a dual layer metallic cathode electrode for a RF-RIE sputter/etching system. This cathode 15 is shown in FIG. 1. An operating embodiment of the device is in a system having 5 inch diameter electrodes, so all of the parameters to be described below are consistent with that size system. The inventive technique, however, scales easily to larger systems. The electrode consists of two metal disk (5 in. dia.) separated by a distance of a few centimeters (1–3). The disks are electrically and structurally connected by narrow metal supports 16 around their outer rim. The connection could also be made by broader supports or walls, but need to have sufficient openings to allow substantial gas flow to the volume between the electrode disks. This is described further later in the specification. The electrode structure has been tested with disk sets of Mo, Cu, C and $SiO_2$ with similar results. Other metal or dielectric materials may be appropriate for the reactive ion etching or deposition of particular materials.

An RF energizing voltage is applied to this electrode set 15. This can be done in a number of ways, and is shown schematically here as simply one electrical connection to the bottom electrode. The other connection would be typically to the containment vessel 20 either directly or through ground. An RF power supply 17 of the same type used to drive prior art RF systems is used to supply a potential to the electrodes through a typical matching network 18 (B. Chapman op. cit.). Gases 22 are supplied to the system from outside the electrodes and a suitable pumping system shown schematically as 23 is required to allow operating pressures in the 0.1 to 400 millitorr range. Samples 24 are then placed on either of the inside electrode surfaces for etching.

The dual electrodes form an effective hollow cathode between their surfaces. Plasma formed in that region is characterized by a sheath at both electrode surfaces. Electrons which are emitted from the electrode surface (due to ion bombardment) are accelerated into the plasma across the sheath. They are repelled, however, by the sheaths at both cathode surfaces, and thus are not able to escape from the discharge region. These entrapped electrons cause a high level of ionization of the gas and very dense plasma between the electrodes. This effect is what is known classically as a hollow cathode glow. In the RF mode, this plasma is characterized by a very low impedance, allowing a high effective current flow at relatively modest power levels. The low plasma impedance is also characterized by a low voltage on the electrodes.

The aforementioned characteristics only apply however if a true hollow cathode glow is formed. This is in contradistinction to the Horwitz apparatus which did not indicate operation in a true hollow cathode state due to the high measured voltages. Thus, with the present invention, the systems are operable with voltages of even more than 300 volts (peak RF) and in most cases use considerably lower voltages. Whereas in the apertures of Horwitz operating voltages in excess of 500 volts are necessary.

Operation of the invention is initiated by backfilling the system with one of the reactive gases listed above to a pressure ranging from 20 to 400 millitorr. The scaling of the system with pressure will be discussed below. Applying RF power to the electrode will initiate breakdown of the gas and form a plasma. With electrode spacing dimensions of 1-3 centimeters, the initial RF voltage will be 600-1000 volts until the discharge is initiated (less than 1 sec.), and then the voltage will drop dramatically. The RF voltage can be estimated by the magnitude of the DC bias voltage on the electrodes. The RF peak voltage should be at least 2 times the DC bias voltage.

The DC bias can be measured with a meter and is always negative with respect to ground due to the fact that ions are swept out of the area much faster than electrons. The RF oscillates around this negative potential rather than ground.

For the embodiment of FIG. 1 there is a dimensional criticality to the structure in order to obtain the requisite intense hollow cathode glow. This criticality may be termed an aspect ratio and may be defined in terms of the dimensions of the hollow cathode electrode structure as the largest dimension of one of the planar electrodes (i.e., a diameter for a circular plate, or a diagonal for a square or rectangular plate) divided by the separation of the plates. This ratio should be equal to or larger than 4. In the Horwitz operation it is approximately 1.

A number of reactive ion etching reactions can be markedly enhanced by this hollow cathode technique. Two specific cases are described below, that of polyimide and silicon etching in particular gases, wherein the increase in etch rate is clearly illustrated. Many other etching reactions are possible, however, such as quartz, other types of resists, copper, chromium and other metals, etc. The techniques will be exactly the same, and only the gas combinations will be different.

Polyimide Etching

Polyimide films are well known polymers, and include any such polymers having an -imide linkage in the backbone or in the side chain of the polymer. These materials are commercially available under several different trade names, and are well known in the packaging of electronic circuits. These films are valued for their high thermal stability and excellent electrical properties. They have high heat resistance, good dielectric properties, are solvent-resistive, and can be applied by simple processing. While they are often used in molding and composite industries, the electronics industry uses them extensively as thin films.

The etching rate of polyimide by prior art techniques (RIE and RF) is in the range of 900 to 1200 angstroms per minute at 300 watts RF. Using the herein disclosed hollow cathode RF electrodes, and with an applied RF power of 300 watts and a peak RF voltage of 200 volts in a gas combination of 10% freon in oxygen at pressures of 150-300 millitorr, and a DC bias voltage of −100 VDC, the erosion rate of polyimide on Si was 2-4 microns per minute. Increasing the power to 1000 watts, the erosion rate was 10-20 microns per minute, depending on the sample temperature. The lower values are characteristic of room temperature, the higher values characteristic of 100° C.

Silicon Etching

With a gas combination of 10% oxygen in Freon at pressures of 100-300 millitorr, the etch rate of silicon samples 24 in the hollow cathode RF electrodes was approximately 2 microns per minute at 500 watts applied power as compared to a prior art rate of 600 angstroms per minute. The DC bias was again low, −75 VDC. The sample temperatures were 50° to 100° C. The peak RF voltage was 150 volts.

The invention differs from Horwitz system in two important ways. First, the hollow cathode effect is induced between two metal electrodes rather than capacitively coupled Si. This helps reduce the impedance of the plasma. Second, the DC bias voltages are extremely low, as compared to either the normal RF case, or the Horwitz system. This very low voltage, which signifies very low ion energies at very high currents, is the dominant useful feature for enhanced RIE etching rates. In the prior art, the voltages are high, the effective currents low, and the etch rate is not enhanced as significantly as in the present invention. The low voltages are also very important to reduce or eliminate metal contamination of the samples by sputtering. At high voltages, there is a sizeable amount of material being sputtered from the electrode surfaces. The present invention is much less susceptible to this problem, however due to the low process voltages, and thus the choice of materials for the electrodes is not critical.

Figure 2:
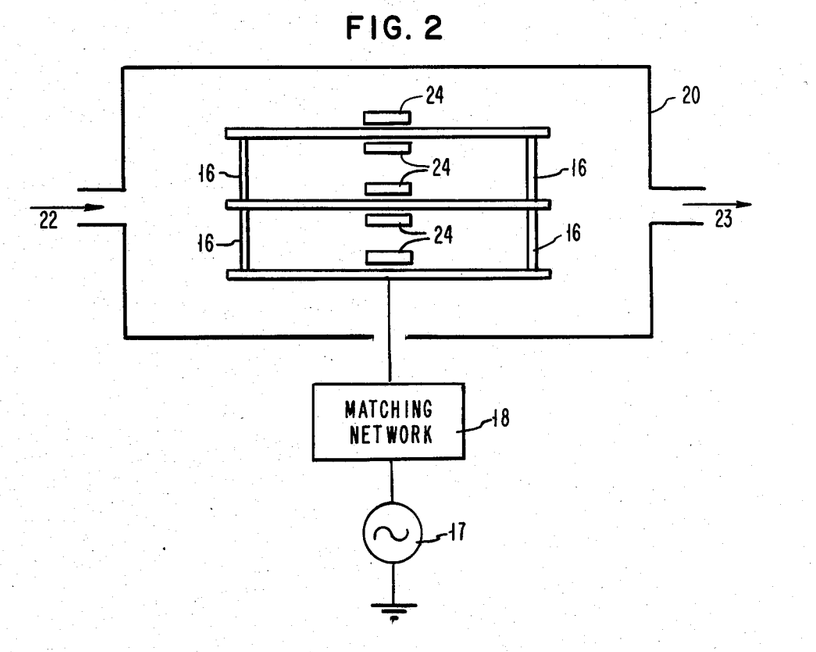
FIG. 2 comprises a simplified cross sectional view of a reactive ion etching system similar to FIG. 1 showing an alternative embodiment of a hollow cathode structure constructed in accordance with the teachings of the present invention.
Figure 3:
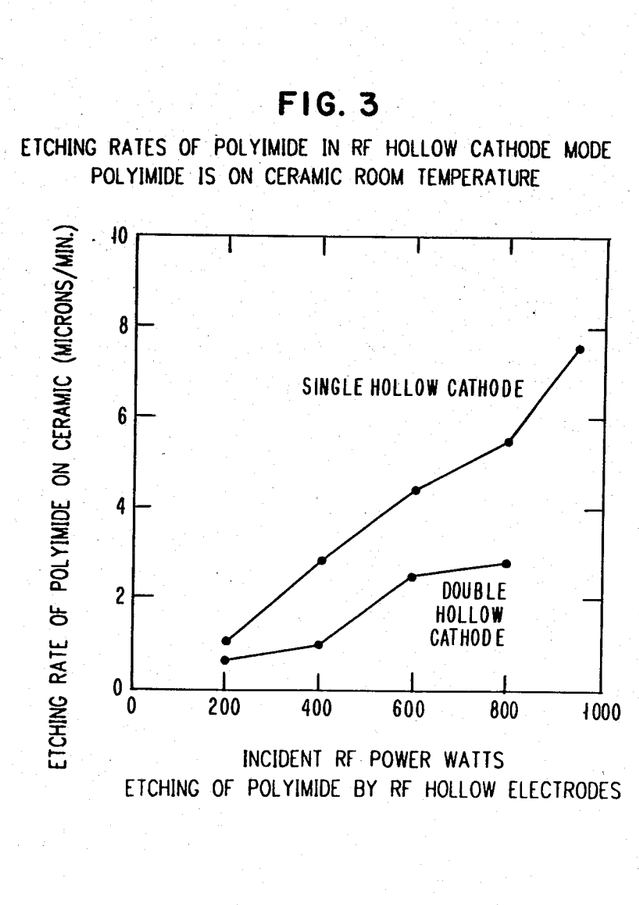
FIG. 3 is a graph illustrating etching rates of a polyimide film in a reactive ion etching apparatus incorporating the teachings of the present invention.

A straightforward extension in this area is to add additional layers of electrodes to produce multiple hollow cathode glows. This is shown schematically for the case of just one additional electrode in FIG. 2. In this figure, the additional electrode, labeled 15', has been mounted above the two electrodes of FIG. 1. The new electrode is supported and electrically connected to the previous electrodes by additional support 16. Devices of this type have been constructed and operated in similar modes to the earlier devices and the relevant operating voltages and etching rates measured. The operation of this multiple hollow cathode RF electrode is similar to the case of the single pair RF electrode described previously. Etching rates, comparing a single hollow cathode (2 electrodes) with a double hollow cathode (3 electrodes) are shown in FIG. 3. As can be seen in FIG. 3, the etching rates for a double hollow cathode are approximately one half the etch rates for a single hollow cathode at the same power level. This is due to an effective sharing of the input power between the two plasmas between the electrodes. The extension to higher numbers of electrodes has also been demonstrated, and the etch rates measured follow similar scaling to the case of a double hollow cathode. The development of this multiple cathode dependance is quite important to the processing area, particularly for multiple wafer etching. The reduction in etch rate due to the multiple plasmas can be compensated for simply by increasing the applied power level.

An equivalent control over the rate of operation is in the choice of the relative sizes of the hollow cathode electrodes and the enclosing chamber, which is usually the vacuum chamber 20. This enclosing chamber 20 functions as the counterelectrode in the RF plasma, and the effective DC bias on the hollow cathode electrodes is related to the ratio of the electrode versus counterelectrode area. By choosing a suitable enclosure dimension, the hollow cathode glow effect can be optimized for high rate, or the degree of isotropy versus anisotropy, which is a function of the operating voltage. At high chamber area to electrode area ratios, the operating voltage will increase causing a reduction in rate, but a higher degree of anisotropy. At low chamber to electrode area ratios, the voltage is reduced and the rate becomes much higher.

Several specific applications are possible with the present device, most of which are not available in prior art. For the purposes of patterning, the present device has several distinct advantages. The first is in mask lifetime. With the high voltages and ion energies present in the prior art, the mask is physically sputtered, and will hence have a relatively short lifetime. The present device, however, with the low, almost sub-sputtering energies will not sputter the mask, and in addition, a material can be chosen which is non-reactive in the plasma of interest. A second useful feature is the ability to operate over a broad pressure range, including pressures up to 500 millitorr without any reduction in reaction rate. The pressure dependance of operation will be discussed below, it being noted that this high operating pressure is not a feature of the prior art. The high operating pressure allows operation in a partial isotropic mode. The etching of the prior art, due to the high energy, is effectively anisotropic. The ability of the present device to operate in a partial isotropic mode allows sloping of sidewalls, which is an important feature for vias and interconnections in thin film devices.

Figure 4:
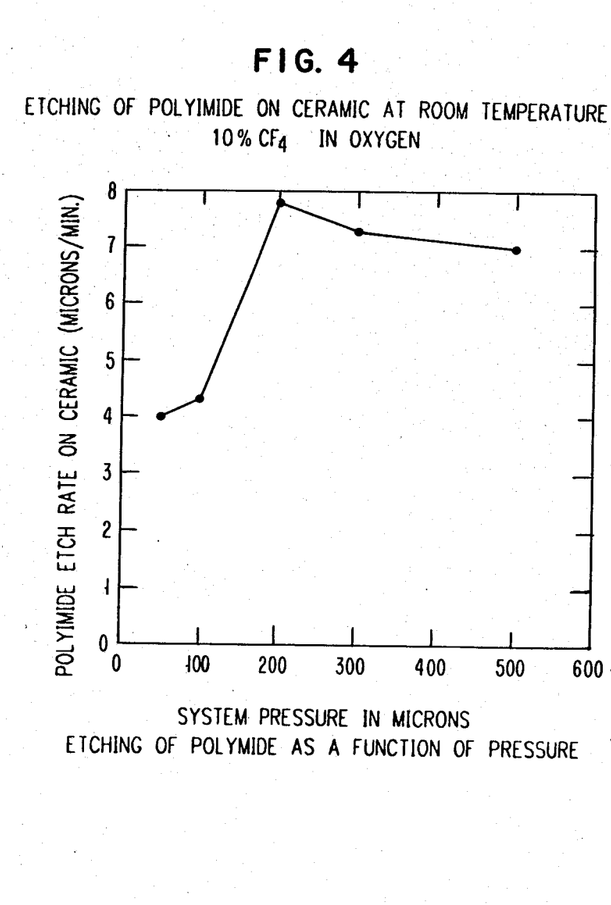
FIG. 4 is a graph similar to FIG. 3 illustrating a similar etching reaction with variations in the active gas pressure.

Several distinct differences in the operating characteristics of the present invention as opposed to prior art clearly indicate that it is measurably different. The prior art device of Horwitz in fact, only approximates or suggests the effect that the present invention utilizes. The principle difference is that of containment. The Horwitz device consists of two small electrodes, separated by a large distance, and enclosed with a non-conducting ring. The purpose of this ring is to help compensate for the lack of sufficient confinement. The major operating differences are the extreme difference in voltage, and differences in the dependance on operating pressure. Also apparent are a factor of at least 10 times greater operating rates herein. The lack of a true hollow cathode glow in Horwitz is indicated by very high operating voltages, in the 500 to 1000 volt range. In the present device, due to the attainment of a well confined hollow cathode glow, the operating voltage is in the 50 volt range. This change in voltage is quite significant, since, at constant power, it leads to a significant increase in effective ion current and much higher measured etching rates. The low voltage of the present device eliminate electrode sputtering, which is a severe complication in prior art devices. The reduction in operating voltage is also quite important for reactions with the electrode material. With a correct choice of materials for a given etching reaction (on some sample), the electrode material can be chosen to form a passivating surface layer, which will not be sputtered away due to the low energy of ion bombardment. At the high ion energy present in prior art RF RIE devices, the formation of this layer is not possible due to physical sputtering. The pressure dependance of the present device is shown in FIG. 4. Far from decreasing at high pressure as in the prior art, the present device operates well at pressures normally used in commercial devices (100–300 millitorr).

Figure 5:
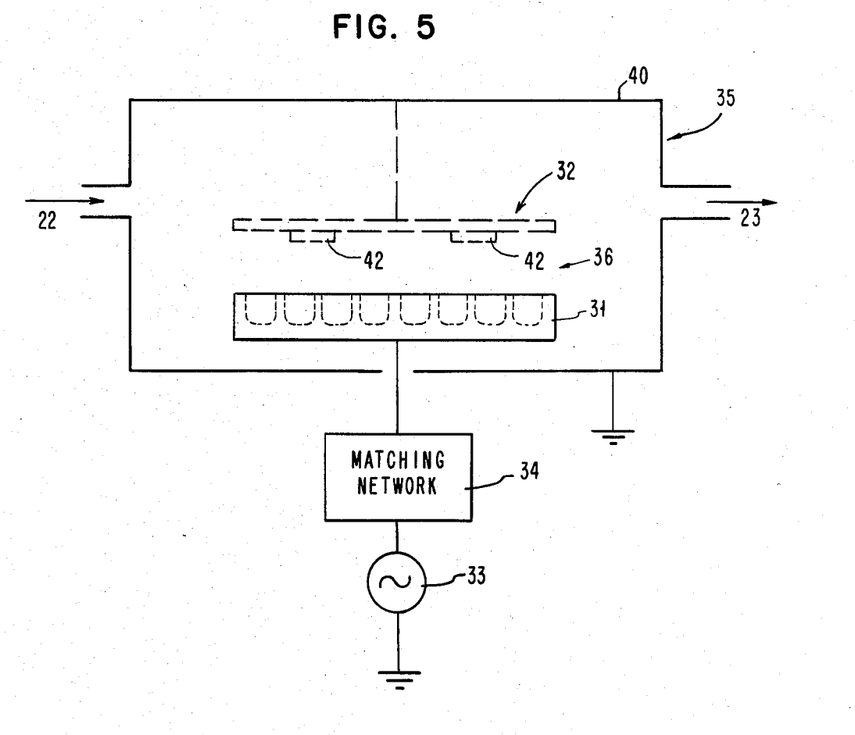
FIG. 5 is a cross sectional view of still another embodiment of a hollow cathode structure suitable for use with the overall active ion etching/sputtering system of the present invention.

A further improvement of the present invention is shown in FIG. 5 and consists of a reconfiguration of the electrode in the basic hollow cathode enhanced RF sputtering system into an array of small hollow cathode glows on a single plate structure. The hollow cathode glows at the electrode surfaces are characterized by higher plasma densities and subsequently increased ion bombardment rates of the electrode surface. This increase in bombardment rate causes an increase in the etch rate and a subsequent increase in the deposition rate on a substrate as with the two planar element electrode structures.

The formation of an array of small hollow cathode glows on the electrode surface is accomplished by making an array of close-packed holes into the electrode material. These holes do not go fully through the electrode material, but stop short of the back. A simple representation of this type of electrode is shown in FIG. 5. Each of these holes is separate, and separated by a thin side wall from the next hole. Since the holes do not extend through the electrode, and have a "bucket-like" appearance, they have been designated "bucket-hollow cathodes" to distinguish them from other modes of hollow cathode glows and arcs.

Figure 6:
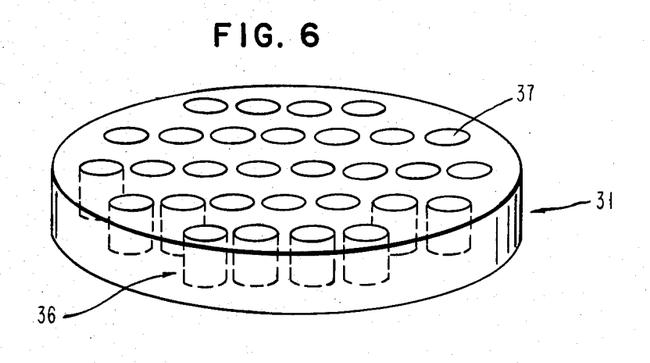
FIG. 6 is a perspective view of the hollow cathode plate of FIG. 5.

In FIG. 5, the primary change from hollow cathode structure described above with reference to FIGS. 1 and 2 is with the shape of the hollow cathode structure 31. The other details of the hollow cathode RF sputtering system are unaffected. The primary electrode, 31, is shown in cross-section in FIG. 5 and the holes in the electrode are designated with dashed lines 36. The detail of this design is shown in more clarity in FIGS. 6 and 7. In FIG. 6, the electrode 31 is shown in perspective. The electrode surface is covered with an array of closely packed holes 37. These holes may be circular or of another geometrical cross-section, such as square or hexagonal. The operation of the device will be unaffected. The formation of these "bucket" structures can also be accomplished by an array of short tubes placed side-by-side in a close packed array, making contact with the base electrode, which would in this case be flat.

The operation of the bucket-hollow cathode effect is as follows. A plasma is initiated in the RF device in the same manner as described previously. At the electrode surface 31, the plasma will extend into each of the openings or buckets in the electrode surface. This is shown schematically in FIG. 7. The plasma sheath 38 will penetrate the hole volume 39, and the inner walls of the bucket will be ion bombarded. Secondary electrons ejected from the surface will be accelerated across the sheath, and gain sufficient energy to ionize the background gas. Before they can leave the electrode area, however, they will be reflected by the sheath at the opposite side of the volume 39. The electron will oscillate many times back and forth in this small volume 39 until it can finally escape into the larger plasma volume above the electrode 31. Because of this trapping of the electron, the ionization level of the background gas will be increased very close to the electrode surface. This increased plasma density caused increased ion bombardment and a higher sputtering rate. This trapping effect is known as a hollow cathode glow.

Figure 7:
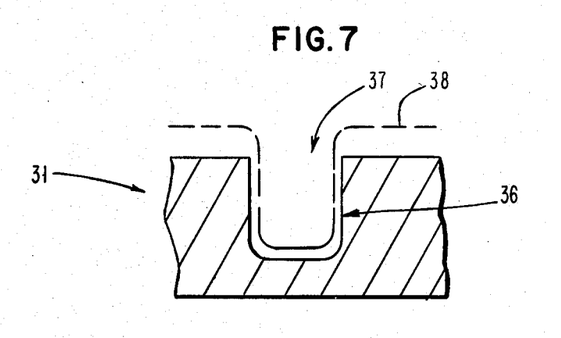
FIG. 7 is a cross sectional view of one of the individual hollow cathode regions or buckets within the plate of FIG. 6.
Figure 8:
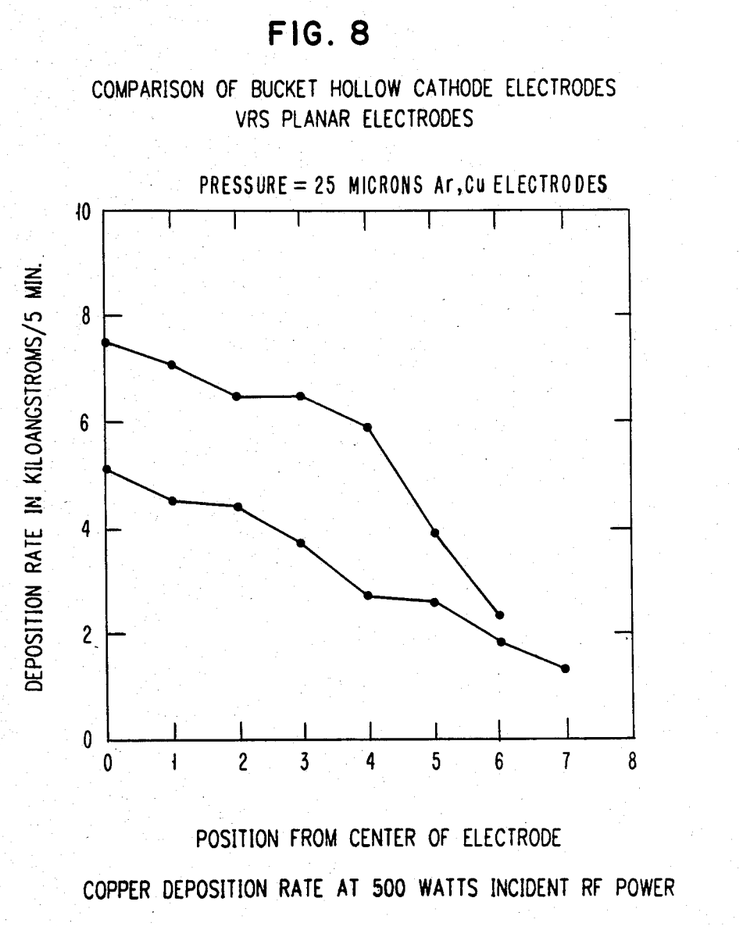
FIGS. 8 through 11 are graphs illustrating the difference of deposition rates between a single planar electrode (not a hollow cathode structure) and the bucket electrodes of FIG. 6, and also illustrating the effect of different pressures within the reaction chamber.
Figure 9:
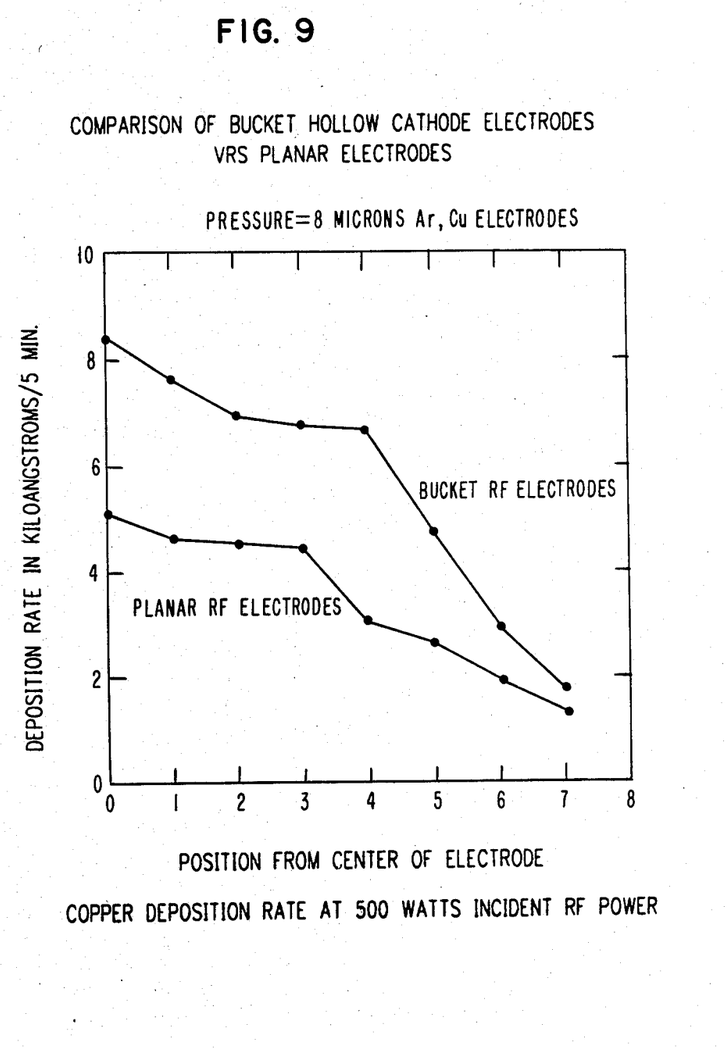
Figure 10:
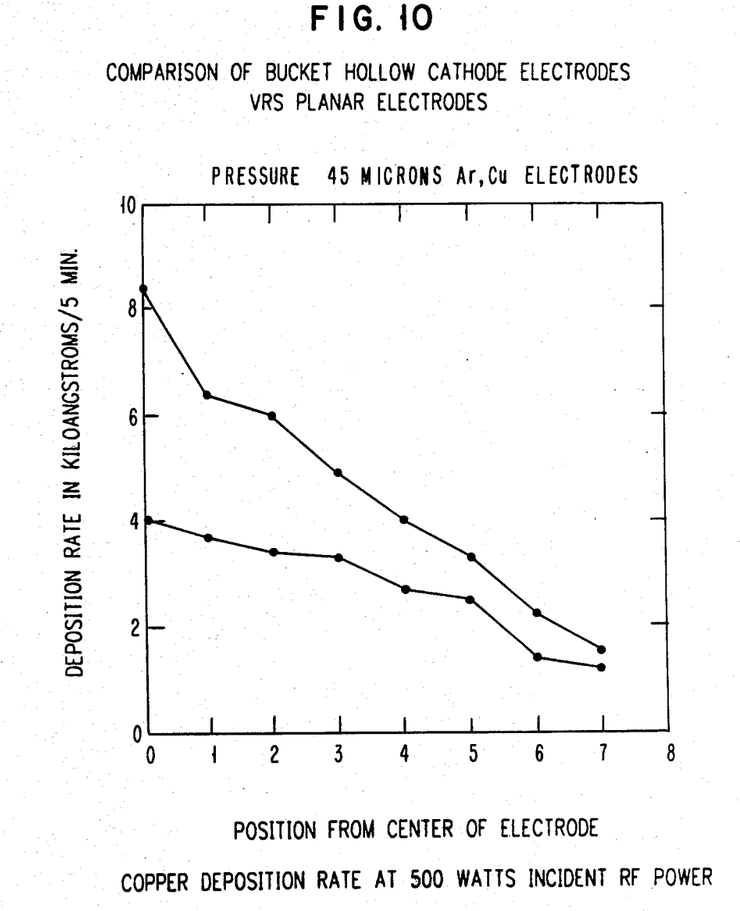
Figure 11:
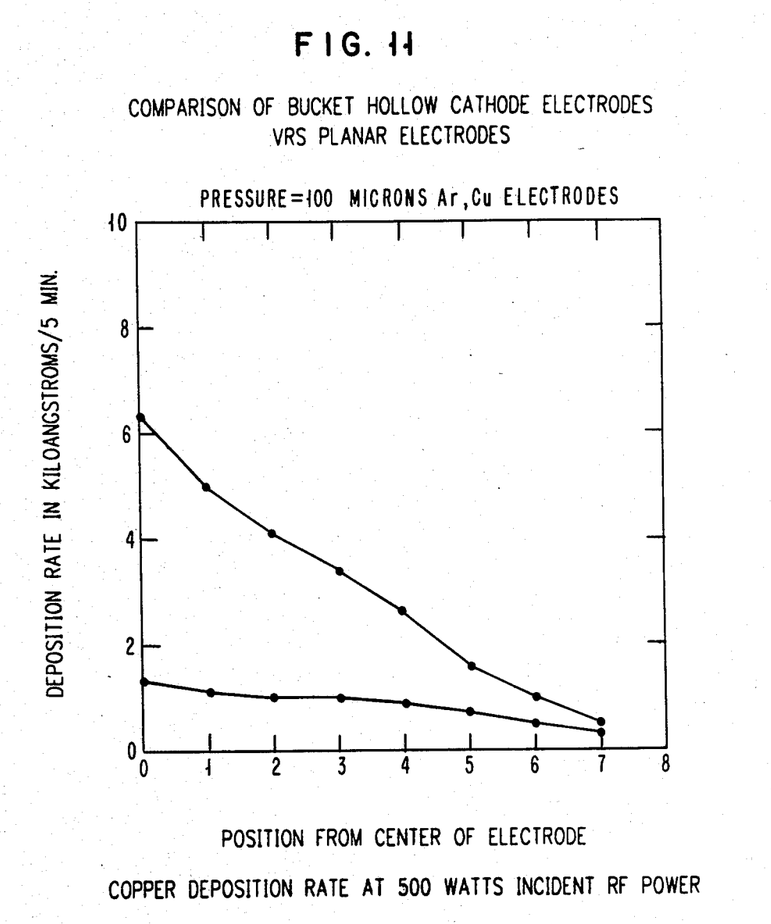

The increased sputtering will occur on all sides and the bottom of the bucket enclosure. Some of the material sputtered from the walls of the bucket will leave the bucket enclosure, as will a large amount of the material sputtered from the floor of the bucket. In general, the net result is an increase in the total amount of material sputtered from the electrode, and subsequently deposited on some external electrode or sample. The aspect ratio of the hole or bucket helps determine both the net increase in the sputter/deposition rate and the directionality of the deposition flux. Because the bucket-hollow cathode electrode can operate in lower pressure regions than the equivalent planar electrode, there is less gas scattering and more directionality to the flux. However, if the holes or buckets are too deep, the amount of material sputtered from the bottom of the hole which actually leaves the bucket volume will be reduced. In practice, an aspect ratio (depth/longest cross-sectional dimension) of 1.5 or greater is necessary for satisfactory operation. For a cylindrical hole the longest cross-sectional dimension would be a diameter; for an elliptical hole it would be the major axis for a rectangular hole it would be the longest diagonal, etc. Too small an aspect ratio results in weakening of the electron trapping and the intensity of the hollow cathode glow effect.

An upper counter electrode 32 is shown in FIG. 5 in dotted lines. This electrode would be at the potential of the containment vessel 40 and serves as a mounting surface for sample 42 to be sputtered or etched. In the embodiment of FIGS. 1 and 2, this isn't necessary as the cathode electrode surface may be used for sample support.

Experimental Results

Sample electrodes of Cu were constructed in accordance with the embodiment of FIG. 5 and operated in a small RF sputtering device. They were compared to single planar Cu electrodes of the same diameter under identical operating conditions. The operating conditions were: input RF power of 100–1000 watts, with less than 20 watts reflected; argon gas in the system at pressures of 20 to 100 millitorr. One set of results is shown in FIGS. 8–11, which shows the deposition rate as a function of position for a single planar electrode case (not hollow cathode) as compared to the bucket-hollow cathode electrodes at the same RF power and other conditions. These results were characteristic of a number of different experimental conditions and were repeatable. The general results are that the deposition rate onto a sample is higher by a factor of almost 2, and the deposition profile is flatter with the bucket-hollow cathode electrodes. The flatter deposition profile results from the collimation aspect of the bucket hollow cathodes.

The electrodes for these experiments were either a flat electrode covered with an array of 1 cm diameter by 1 cm deep holes, or an array of short copper tubes of approximately the same dimensions set closely together on a flat copper plate.

The extension of this technique to other electrode materials is straightforward. The effect is primarily geometrical, and operates in the same manner with metal or insulating electrode materials.

In the broadest sense the physical relationship for the hollow cathode structure for the proper operation of both embodiments may be described in terms of a "partially enclosed" electrode. The ratio of electrode surface to "open" area in the electrode structure should exceed two (2). Stated differently, within the orientation of the electrode structure, a volume is defined. The surface area of the actual walls of this volume divided by the open area should be $\geq 2$. Thus, with the embodiment of FIG. 1 this would be the surface area of the disks facing the volume divided by the area of the cylinder at the edges of the disks. In the embodiment of FIG. 5 this ratio could be the area of the sides (cylinder) of each hole plus the bottom area divided by the area of the opening. It should be noted in passing that this ratio in the Horwitz device would be less than 1 due to the much greater spacing between his disks. It should also be noted that the individual aspect ratios defined previously also hold for the two embodiments described with reference to FIGS. 1 and 5.

Industrial Applicability

As stated previously the present invention has wide application in the semiconductor production industry for the making of various layered semiconductor structures which would normally be made utilizing RF reactive ion etching sputter/etching processes either for the deposition of materials upon the substrate or for the removal of materials by the volatization of target materials using a reactive gas.

Due to the high current density, high process rates are possible utilizing the principles of the invention for greater product throughput. Due to the low voltage operating characteristics it is possible to sputter/etch such materials as polyimides without adversely affecting surrounding areas.

It is also possible, utilizing the multi-electrode embodiment comprising a plurality of plate-like electrodes to in effect, provide a "cassette-like" loading mode wherein samples could be inserted in the various hollow cathode glow regions utilizing the electrodes as the sample holders much like cassette drawers.

Another potential utilization of the invention, due to the unusually high process rates possible, involves the stripping of photoresist material from substrates and also just plain "cleaning" or "glow discharge cleaning" to remove unwanted deposits from sample holders and the like prior to starting a new production run.

Other uses and advantages of the invention will be apparent to those skilled in the art.

Having thus described our invention, what we claim as new, and desire to secure by Letters Patent is:

1. In an RF sputter/etching system including an evacuated chamber, the improvement which comprises a partially enclosed electrode structure which produces a pronounced hollow cathode glow within the electrode structure when energized with an RF voltage source,
    means for supplying one side of an RF voltage source of up to 300 volts peak to the electrode structure,
    said electrode structure comprising a single plate hollow cathode electrode structure having on at least one side thereof a plurality of small individual hollow cathode chambers defined by side walls and a bottom having a uniform cross-sectional size and shape, the tops being open to the system chamber and wherein the side walls are substantially perpendicular to the bottoms,
    said individual chambers having an aspect ratio defined as the depth/longest cross-sectional dimension of an individual chamber of at least 1.5,
    means for supplying an ionizeable gas to the system from outside the electrode structure, and
    means for supporting workpieces adjacent to the hollow cathode glow within the electrode structure for sputter/etching.

2. An RF sputter/etching system as set forth in claim 1 wherein said individual hollow cathode chambers comprise a series of holes in the surface of said plate.

3. An RF sputter/etching system as set forth in claim 2 wherein said individual hollow cathode chambers are cylindrical in shape.

4. An RF sputter/etching system as set forth in claim 1 wherein said individual hollow cathode chambers comprise a plurality of short tubes attached at one end to said plate and being open at the other.

* * * * *